United States Patent [19]

Machida et al.

[11] Patent Number: 4,734,648

[45] Date of Patent: Mar. 29, 1988

[54] QUADRATURE DETECTION CIRCUIT FOR NUCLEAR MAGNETIC RESONANCE APPARATUS

[75] Inventors: Yoshio Machida, Tochigi; Masahiko Hatanaka, Otawara, both of Japan

[73] Assignee: Kabushiki Kaisha Toshiba, Kawasaki, Japan

[21] Appl. No.: 31,803

[22] Filed: Mar. 30, 1987

[30] Foreign Application Priority Data

Mar. 31, 1986 [JP]  Japan ................................. 60-70788

[51] Int. Cl.$^4$ ............................................ G01R 33/20
[52] U.S. Cl. ...................................... 324/322; 324/307
[58] Field of Search ............... 324/300, 307, 309, 310, 324/311, 312, 313, 314, 318, 322; 128/653

[56] References Cited

U.S. PATENT DOCUMENTS

| 3,501,691 | 3/1970 | Ernst | 324/307 |
|---|---|---|---|
| 3,999,118 | 12/1976 | Hoalt | 324/314 |
| 4,446,431 | 5/1984 | McKay | 324/322 |
| 4,602,213 | 7/1986 | Sugiura | 324/307 |
| 4,604,580 | 8/1986 | Sugiura et al. | 324/311 |
| 4,628,262 | 12/1986 | Maudsley | 324/307 |
| 4,689,567 | 8/1987 | Maudsley | 324/309 |

Primary Examiner—Michael J. Tokar
Attorney, Agent, or Firm—Schwartz, Jeffery, Schwaab, Mack, Blumenthal & Evans

[57] ABSTRACT

A quadrature detection circuit compensates for phase and amplitude differences in an NMR quadrature detection apparatus. The quadrature detection circuit comprises a test signal generator, first and second modulators, amplitude detectors, phase error detectors and a corrector. The corrector compensates the NMR signal as to phase and amplitude factors determined during an initial calibration mode utilizing the test signals, thus eliminating ghost images of the object which would otherwise be formed during image reconstruction.

12 Claims, 4 Drawing Figures

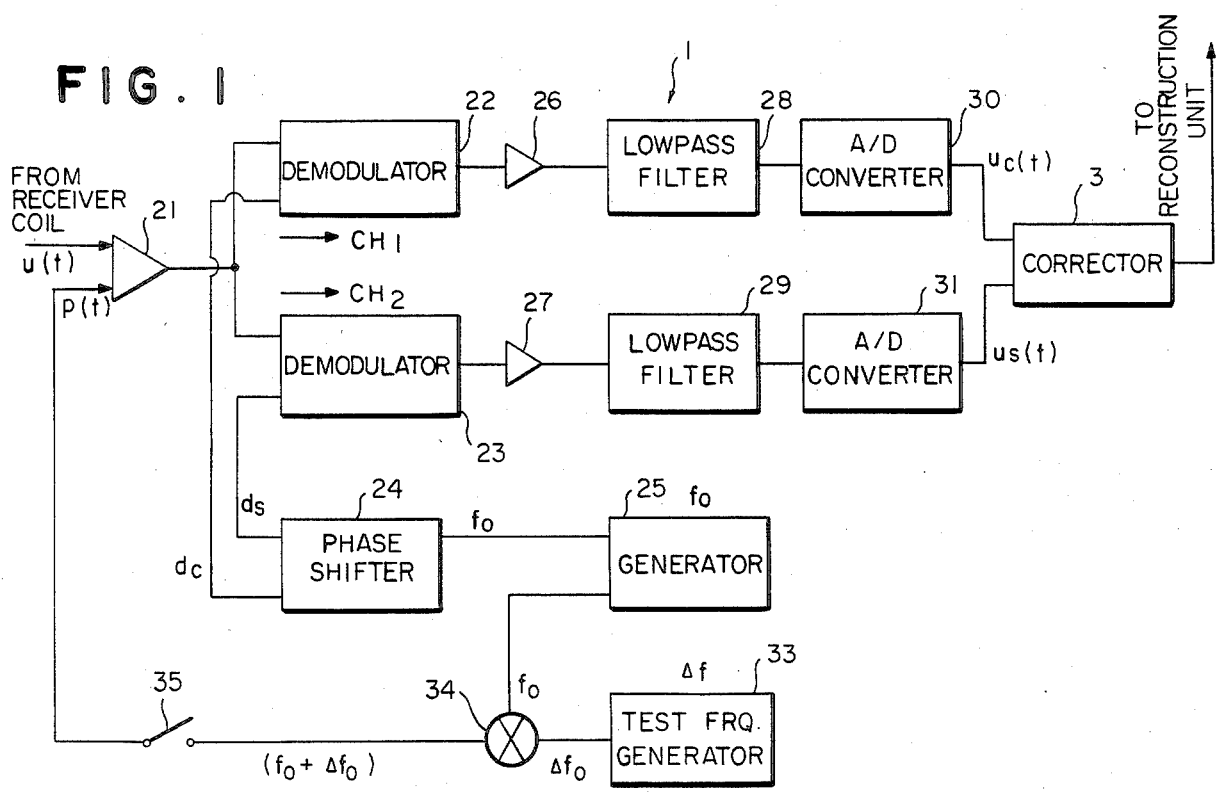
FIG. 1
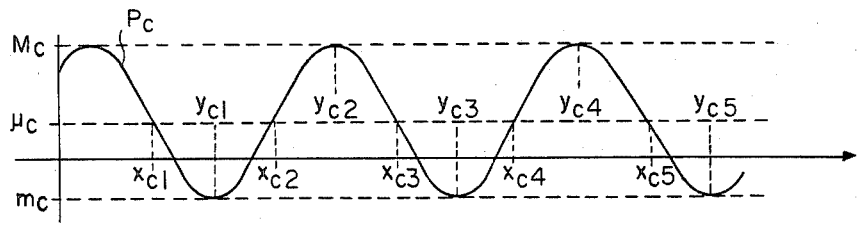
FIG. 2A
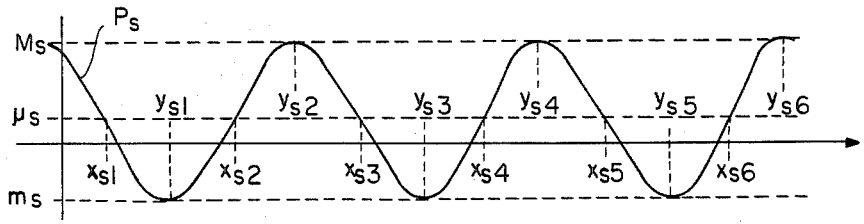
FIG. 2B
FIG. 3
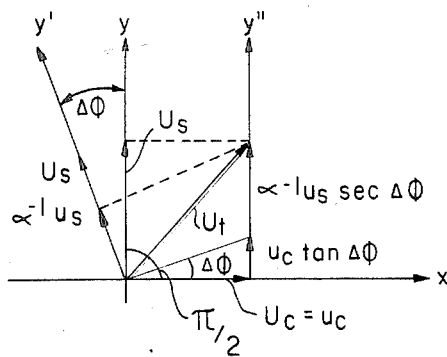

QUADRATURE DETECTION CIRCUIT FOR NUCLEAR MAGNETIC RESONANCE APPARATUS

BACKGROUND OF THE INVENTION

1. Field of the Invention

This invention relates to nuclear magnetic resonance (NMR) apparatus for examining an object such as a patient by measuring a density or a relaxation time of a specific atomic nucleus, e.g., a proton. The invention relates more particularly to a quadrature detection circuit for the NMR apparatus.

2. Description of the Prior Art

It is difficult to directly observe a nuclear magnetic resonance signal, because a resonance occurs at relatively high frequencies and any frequency differences which may be of interest are very small in comparison. Accordingly, it is convenient to view a spin system as if one of the spin resonances is stationary, i.e., in a frame of resonance rotating at the same frequency. Practically, this is done in the NMR receiver by demodulating the NMR signals with a reference frequency which is chosen to be close to or equal to the resonance frequency. The resultant detected output is then the frequency difference between the spin resonance and the reference, which will be typically in the audio frequency range and can easily be observed and measured.

The phase of the spins is an angle describing the direction in which the resultant spin magnetization is pointing relative to the effective direction of the reference frequency in the rotating frame. The zero phase reference is arbitrary, though it is frequently chosen to be the direction in which all the spins point immediately after the initial radio frequency (rf) excitation pulse. A spin at right angles to this will be at 90-degrees phase, or $\pi/2$ radians. For a signal resonating exactly at the reference frequency the phase will be constant, but for other spin resonance frequencies the phase will be continually changing. This appears as an oscillating amplitude of the detected signal with a maximum signal obtained when the spin phase is the same as the reference, zero when there is a 90-degree phase difference, and negative when at 180 degrees from the reference. For this reason, this method of detection is known as phase sensitive detection. The quadrature detection circuit performs the signal detection relative to both a zero phase reference and a 90-degrees phase reference which is a complete description of the spin movement in the transverse plane.

Thus, the quadrature detection circuit produces a signal of twice the single phase detection power by adding both 0-degree and 90-degree phases of the demodulated signals. Accordingly, this quadrature circuit reduces noise power by a factor of 2, thereby increasing the signal-to-noise ratio by $\sqrt{2}$.

In conventional quadrature, an NMR signal u(t) from a receiver coil of an NMR apparatus is demodulated with the respective reference signals $d_c$ and $d_s$ of the same frequency, but whose phases are different by 90 degrees. Thus, two demodulated signals $u_c(t)$ and $u_s(t)$ are extracted from the NMR signal u(t) as follows:

$$u_c(t) = G_c u(t) d_c(t) \quad (1)$$

$$u_s(t) = G_s u(t) d_s(t) \quad (2)$$

where the reference signals $d_c$ and $d_s$ are described as follows:

$$d_c(t) = A_c \cos(2\pi f_0 t + \phi_c) \quad (3)$$

$$d_s(t) = A_s \cos(2\pi f_0 t + \phi_s) \quad (4)$$

and $G_c$ and $G_s$ are gains of the demodulation circuit and $A_c$ and $A_s$ are amplitudes of the reference signals $d_c$ and $d_s$, $f_0$ is a frequency of the reference signals $d_c$ and $d_s$, $\phi_c$ and $\phi_s$ are the phases of the respective reference signals $d_c$ and $d_s$.

If the amplitude $A_c$ is equal to $A_s$, and the phase difference between $\phi_c$ and $\phi_s$ is exactly 90 degrees, the quadrature circuit will produce the correct demodulated signals $u_c(t)$ and $u_s(t)$.

However, it is difficult to make the amplitudes $A_c$ and $A_s$ of reference signals $d_c$ and $d_s$ exactly equal and the phase difference between the same 90 degrees. Such amplitude and phase errors cause a ghost image to be generated overlying the image of the object being observed.

SUMMARY OF THE INVENTION

It is an object of the present invention to provide a quadrature circuit for NMR apparatus which can produce an image of an object without a ghost image thereon.

It is another object of the present invention to provide a quadrature circuit for detecting an amplitude difference between two reference signals, to demodulate an NMR signal from a receiver coil and to compensate the demodulated signals for such an amplitude difference therebetween.

It is another object of the present invention to provide a quadrature circuit for detecting a phase difference between two reference signals, to demodulate the NMR signal from the receiver coil and to compensate the demodulated signals for such a phase error therebetween.

To obtain the above objects, the present invention includes a test signal generator. This test signal generator generates a test signal whose frequency is slightly different from that of the reference signals. The generator supplies the test signals to a dp modulation circuit instead of to the NMR signal from the receiver coil. The demodulation circuit demodulates the test signal with the two different reference signals to produce two different demodulated signals of 0-degree and 90-degree phases. A/D converters sample and convert the respective demodulated signals into digital forms. A corrector receives the digital demodulated signals respectively and first, detects maximum and minimum amplitudes of both the 0-degree and 90-degree phases of the digital demodulated signals to detect amplitude offsets of same, and then measures times of both demodulated signals when the signals meet with the respective offsets between the maximum and minimum of the respective demodulated signals to obtain a period difference and a phase difference between the signals.

Next, the corrector calculates an amplitude ratio between the demodulated signals of 0-degree and 90-degree phases from the amplitude difference and phase error to 90-degree phase between the demodulated signals of 0-degree and 90-degree phases from the period difference and phase difference between the same, whereby to compensate at least one of the demodulated signals of 0-degree and 90-degree phases for the amplitude difference and phase error between the same from the amplitude ratio and the phase error.

BRIEF DESCRIPTION OF THE DRAWINGS

For a better understanding of the present invention, reference is made to the following detailed description of the invention to be read in conjunction with the following drawings, wherein:

FIG. 1 shows a block diagram of an embodiment according to the present invention;

FIGS. 2A and 2B illustrate functions of the corrector according to the present invention; and FIG. 3 illustrates the relation between vectors of demodulated signals and compensated signals of 0- and 90-degree phases.

DETAILED DESCRIPTION OF THE PREFERRED EMBODIMENTS

Referring to FIG. 1, a generator 25 generates a signal of frequency $f_o$ and supplies the same to a phase shifter 24 and a mixer 34. The phase shifter 24 generates reference signals $d_c$ and $d_s$, e.g., cosine and sine waves, whose phases are different by 90 degrees from each other, from the signal of frequency $f_o$ supplied from the generator 25 and supplies the same to demodulators 22 and 23 of channels 1 and 2, respectively. A test frequency generator 33 generates a signal of frequency $\Delta f_o$ near an audio frequency and supplies the same to the mixer 34. The mixer mixes both signals $f_o$ and $\Delta f_o$ to generate a test signal $p(t)$ of the frequency $f_o + \Delta f_o$ and supplies the signal $p(t)$ to an amplifier 21 via a switch 35. The switch 35 turns on when the quadrature circuit 1 is calibrated.

An NMR signal $u(t)$ is supplied from a receiver coil of an NMR apparatus (not shown) to the amplifier 21. The amplifier 21 alternatively receives and amplifies the signal $u(t)$ or $p(t)$. The demodulators 22 and 23 demodulate the signal $p(t)$ or $u(t)$ with the respective reference signals $d_c$ and $d_s$ and supply the demodulated signals $p_c(t)$ and $p_s(t)$ or $u_c(t)$ or $u_s(t)$ to corresponding lowpass filters 28 and 29 via amplifiers 26 and 27 of channels 1 and 2. The lowpass filters 28 and 29 pass audio frequencies and supply the filtered signals to A/D converters 30 and 31 of the channels 1 and 2. The A/D converters convert the respective outputs of the lowpass filters 28 and 29 into digital form and supply their digital outputs to a corrector 3. The corrector 3 calculates an amplitude ratio and phase error from $p_c(t)$ and $p_s(t)$ and compensates $u_c(t)$ and $u_s(t)$ for the amplitude and phase error caused by the quadrature circuit 1.

Switch 35 is closed during calibration of the quadrature circuit 1. The test signal $p(t)$ of frequency $f_o + \Delta f_o$ is supplied to the amplifier 21. This $p(t)$ is represented as follows:

$$p(t) = P \cos [2\pi(f_o + \Delta f_o)t + \phi_p] \quad (5)$$

where $\phi_p$ is a phase of the test signal $p(t)$ and $P$ is an amplitude of the test signal.

At this time, the NMR signal $u(t)$ is not supplied to the amplifier 21. The test signal $p(t)$ is demodulated by the demodulators 22 and 23 of the channels 1 and 2 with the sine and cosine reference signals $d_c$ and $d_s$ to perform quadrature detection of the test signal $p(t)$. The demodulated signals $p_c(t)$ and $p_s(t)$ of both channels 1 and 2 are converted in A/D converters 30 and 31 into digital discrete forms $P_c(R)$ and $P_s(R)$ [$R = 1, 2, 3, \ldots, N$] after passing through lowpass filters 28 and 29.

The demodulated test signals $p_c(t)$ and $p_s(t)$ are represented as follows:

$$p_c(t) = PA_c \cos [2\pi(\Delta f_o)t + (\phi_p - \phi_c)] \quad (6)$$

$$p_s(t) = PA_s \sin [2\pi(\Delta f_o)t + (\phi_p - \phi_s)] \quad (7)$$

where $A_c$ and $A_s$ are amplitudes of the reference signals $d_c$ and $d_s$, $(\phi_p - \phi_c)$, $(\phi_p - \phi_s)$ are phase differences between the respective reference signals $d_c$ and $d_s$ and the test signal $p(t)$.

The A/D converters 30 and 31 sample the test signal at an adequately large sampling rate so as not to degrade the accuracy of the originals.

Step 1—Part 1: Calculation of Amplitude Ratio

Now it will be explained how to obtain an amplitude ratio of the demodulated test signals $P_c(R)$ and $P_s(R)$ shown in FIGS. 2A and 2B. The demodulated signals $P_c(R)$ and $P_s(R)$ include DC biases.

First, the corrector 3 calculates the respective maximums $M_c$, $M_s$ and minimums $m_c$, $m_s$ from the signals $P_c(R)$ and $P_s(R)$.

The maximum of $P_c(R)$ $$M_c = \max[P_c(R) \mid R = 1,2,3,\ldots,N]$$

The maximum of $P_s(R)$ $$M_s = \max[P_s(R) \mid R = 1,2,3,\ldots,N]$$

The minimum of $P_c(R)$ $$m_c = \min[P_c(R) \mid R = 1,2,3,\ldots,N]$$

The minimum of $P_s(R)$ $$m_s = \min[P_s(R) \mid R = 1,2,3,\ldots,N]$$

The mean values or offsets $\mu_c$ and $\mu_s$ of $P_c$, $P_s$ are calculated as follows:

$$\mu_c = \frac{M_c + m_c}{2}$$

$$\mu_s = \frac{M_s + m_s}{2}$$

The amplitudes $a_c$ and $a_s$ of the signals $P_c(R)$ and $P_s(R)$ are calculated as follows:

$$a_c = \frac{M_c - m_c}{2}$$

$$a_s = \frac{M_s - m_s}{2}$$

Accordingly, the amplitude ratio $\alpha$ between the digitized, demodulated test signals $P_c(R)$ and $P_s(R)$ is as follows:

$$\alpha = \frac{A_s}{A_c} = \frac{PA_s}{PA_c} = \frac{a_s}{a_c}$$

Step 1—Part 2: Calculation of Phase Error

First, the corrector 3 obtains positions, $x_{c1}, x_{c2}, x_{c3}, \ldots, x_{cN}$ which satisfy $P_c(x_{ci}) = \mu_c$ as shown in FIG. 2A. The corrector 3 also obtains positions $x_{s1}, x_{s2}, x_{s3}, \ldots, x_{sN}$ which satisfy $P_s(x_{si}) = \mu_s$ as shown in FIG. 2B.

Next, the corrector 3 calculates mean positions $y_{ci}$, $y_{si}$ which indicate peak and nadir positions of $P_c$ and $P_s$ as follows:

$$y_{ci} = \frac{x_{ci} + x_{ci+1}}{2}$$

$$y_{si} = \frac{x_{si} + x_{si+1}}{2}$$

where i is an integer more than 1.

$y_{ci}$ and $y_{si}$ form an arithmetic series, even if $\mu_c$ and $\mu_s$ are not exact. However, it is preferable to obtain the positions $x_{ci}$, $x_{si}$ around $\mu_c$ and $\mu_s$, since $P_c$ and $P_s$ are changing considerably and $x_{ci}$ and $x_{si}$ become accurate around there.

Thus, the averaged half-period of both the $P_c$ and $P_s$ and phase difference between the phases of the $P_c$ and $P_s$ are represented as follows:

$$\eta = \frac{\overline{y_{ci+1} - y_{ci}} + \overline{y_{si+1} - y_{si}}}{2}$$

$$\xi = \overline{y_{ci+1} - y_{si}}$$

where i is an odd integer and the bar ( ) indicates the mean value over i.

Accordingly, phase error to 90-degree phase between $P_c$ and $P_s$ is calculated by the corrector 3 as follows:

$$\Delta\phi = \frac{\xi}{2\eta} 2\pi - \frac{\pi}{2} \quad (8)$$

$\Delta\phi$ is represented as follows:

$$\Delta\phi = (\phi_c - \phi_s) - \frac{\pi}{2}$$

$$= (\phi_p - \phi_s) - (\phi_p - \phi_c) - \frac{\pi}{2}$$

$(\phi_p - \phi_s)$ and $(\phi_p - \phi_c)$ are phase portions of the respective equations (7) and (6). Therefore, the difference between these phase portions approximates equation (8).

In this way, the corrector 3 calculates the amplitude ratio $\alpha$ and phase error $\Delta\phi$ from the test signal p(t).

Step 2: Compensation For an NMR Signal According To the Amplitude Ratio And Phase Error After calculation of an amplitude ratio and phase error using the test signal p(t), the switch 35 turns off (opens) and the NMR signal u(t) is supplied to the amplifier 21. The demodulator 22 and 23 demodulate the NMR signal u(t) with the sine and cosine reference signals $d_c$ and $d_s$. The demodulated signals $u_c(t)$ and $u_s(t)$ of digital form are supplied to the corrector 3 through the amplifiers 26, 27, the lowpass filters 28, 29 and the A/D converters 30, 31 in the respective channels 1 and 2.

The corrector 3 compensates the demodulated NMR signals $u_c(t)$ and $u_s(t)$ for the amplitude ratio $\alpha$ and phase error $\Delta\phi$ as follows:

$$U_c(t) = u_c(t) \quad (9)$$

$$U_s(t) = \tan(\Delta\phi) \cdot u_c(t) + \alpha^{-1} \sec(\Delta\phi) \cdot u_s(t) \quad (10)$$

where $U_c(t)$ and $U_s(t)$ indicate the corrected signals of the demodulated NMR signals $u_c(t)$ and $u_s(t)$.

Equations (9) and (10) are easily understood from the vector chart as shown in FIG. 3. A vector $U_T$ indicates the spin movement. This spin movement is detected by 0-degree and 90-degree phase references. In other words, the vector $U_T$ is projected onto the x-axis and y-axis. These projected vectors indicate the detected or modulated signals $u_c$ and $u_s$. If these x and y axes do not cross each other at right angles because of the phase error of the quadrature circuit, the vector $U_T$ is projected onto a y'-axis rotated from the y-axis by the phase error $\Delta\phi$. Furthermore, if there is an amplitude difference in the quadrature circuit, the modulated signal is detected, as $u_s$ on the y'-axis as shown in FIG. 3.

Accordingly, first, the demodulated signal $u_s$ is compensated for the amplitude difference so as to coincide with the divided vector of $U_T$ projected onto the y'-axis. This means $u_s$ multiplied by $\alpha^{-1}$. Next, the $\alpha^{-1} u_s$ is projected onto a y" axis which is parallel to the y-axis. This corresponds to the product $\alpha^{-1} u_s \sec(\Delta\phi)$. Then, $u_c \tan(\Delta\phi)$ is added to $\alpha^{-1} u_s \sec(\Delta\phi)$ so that the amplitude of $U_s$ is equal to that of $U_c$.

Thus, the vectors $U_c$ and $U_s$ have the same amplitude and are at 90-degrees phase relative to each other.

In this embodiment, the demodulated signal $u_s$ is compensated on the base of the demodulated signal $u_c$. However, it is possible to compensate the demodulated signal $u_c$ instead of $u_s$, or both.

The compensated signals $U_c$ and $U_s$ are supplied to the reconstructor (not shown) to reconstruct an image of the object.

It is understood that the corrector 3 may comprise, for example, single logic circuits configured to perform the functions described above in conjunction with memory storage devices or registers to store the various discrete signals corresponding to the waveforms of FIGS. 2A and 2B. Alternately, the corrector 3 may comprise a microprocessor programmed to execute the functions set forth above, again utilizing stored values of the waveforms, or selected portions thereof, to enable suitable calculations of mean values, etc.

Although the invention has been described in reference to preferred embodiments, it is understood that modifications and improvements may be made by those skilled in the art and the invention is intended to cover all such modifications and improvements which fall within the spirit of the invention as set forth by the appended claims.

What is claimed is:

1. A quadrature detection circuit for nuclear magnetic resonance apparatus, comprising:
    (a) means for generating first and second reference signals having a phase shift relative to one another, and having a common frequency $f_o$;
    (b) a test signal generator for generating a test signal having a frequency $\Delta f_o$ which is slightly different from that of said first and second reference signals;
    (c) first and second demodulating means for demodulating the test signal with said first and second reference signals respectively to respectively produce first and second demodulated signals;
    (d) amplitude detecting means for detecting first and second amplitudes of said first and second demodulated signals to obtain an amplitude difference therebetween;
    (e) phase error detecting means for detecting the period of at least one of said first and second demodulated signals and phase difference between said first and second demodulated signals to obtain a phase error; and, (f) compensating means for compensating an NMR signal demodulated by said demodulating means with said first and second reference signals for said phase error and amplitude difference.

2. The quadrature detection circuit according to claim 1, wherein said phase error detecting means detects phase positions in which the first and second demodulated signals intersect offsets and calculates mean positions of the adjacent detected phase positions to define peak and nadir positions of the respective first and second demodulated signals.

3. The quadrature detection circuit according to claim 2, wherein said phase error detecting means includes means for averaging differences between adjacent mean positions for at least one of said first and second demodulated signals.

4. The quadrature detection circuit according to claim 3, wherein said phase error detecting means includes means for calculating the phase difference by averaging differences between the mean positions of said first demodulated signals and the mean positions of said second demodulated signals to obtain the phase error which differs from a 90-degree phase difference therebetween.

5. The quadrature detection circuit according to claim 1, wherein said compensating means calculates compensated signals as follows:

$$U_c(t) = u_c(t)$$

$$U_s(t) = \tan(\Delta\phi) \cdot u_c(t) + \alpha^{-1} \sec(\Delta\phi) \cdot u_s(t)$$

where $U_c(t)$ and $U_s(t)$ are the compensated signals, $u_c(t)$ and $u_s(t)$ are the first and second demodulated signals of the NMR signals, $\alpha$ is an amplitude ratio of the first and second demodulated signals corresponding to said amplitude difference, and $\Delta\phi$ is the phase error which differs from a 90-degree phase difference between the first and second demodulated signals.

6. A quadrature detection circuit as recited in claim 1, wherein said phase shift of said first and second reference signals is 90 degrees.

7. A method of compensating an NMR signal for amplitude and phase errors comprising the steps of:

(a) generating first and second reference signals having a phase shift relative to one another and having a common frequency $f_o$, (b) generating a test signal having a frequency $\Delta f_o$ which is slightly different from that of said first and second reference signals;

(c) demodulating said test signal with said first and second reference signals respectively to respectively produce first and second demodulated signals;

(d) detecting first and second amplitudes of said first and second demodulated signals to obtain an amplitude difference therebetween;

(e) detecting the period of at least one of said first and second demodulated signals and phase difference between said first and second demodulated signals to obtain a phase error;

(f) demodulating said NMR signal with said first and second reference signals to respectively produce first and second demodulated NMR signals; and (g) compensating said first and second demodulated NMR signals for said phase error and amplitude difference.

8. The method as recited in claim 7, wherein said generating step (a) includes the step of generating said first and second reference signals with a relative phase shift of 90 degrees.

9. The method as recited in claim 8, wherein said step (e) includes the step of detecting phase positions in which the first and second demodulated signals intersect offsets and calculating mean positions of the adjacent detected phase positions to define peak and nadir positions of the respective first and second demodulated signals.

10. The method as recited in claim 7, wherein said step (e) includes averaging differences between adjacent mean positions for at least one of said first and second demodulated signals.

11. The method as recited in claim 10, wherein said step (e) further includes calculating the phase difference by averaging differences between the mean positions of said first demodulated signals and the mean positions of said second demodulated signals to obtain the phase error which differs from a 90-degree phase difference therebetween.

12. The method as recited in claim 7, wherein said step (g) includes compensating said first and second demodulated NMR signals in accordance with the following:

$$U_c(t) = u_c(t)$$

$$U_s(t) = \tan(\Delta\phi) \cdot u_c(t) + \alpha^{-1} \sec(\Delta\phi) \cdot u_s(t)$$

where $U_c(t)$ and $U_s(t)$ are the compensated signals, $u_c(t)$ and $u_s(t)$ are the first and second demodulated signals of the NMR signals, $\alpha$ is an amplitude ratio of the first and second demodulated signals corresponding to said amplitude difference, and $\Delta\phi$ is the phase error which differs from a 90-degree phase difference between the first and second demodulated signals.

* * * * *